United States Patent
Ina et al.

(10) Patent No.: US 6,639,677 B1
(45) Date of Patent: Oct. 28, 2003

(54) POSITION MEASURING METHOD AND POSITION MEASURING SYSTEM USING THE SAME

(75) Inventors: Hideki Ina, Yokohama (JP); Hiroshi Morohoshi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 527 days.

(21) Appl. No.: 09/666,483

(22) Filed: Sep. 20, 2000

(30) Foreign Application Priority Data

Sep. 21, 1999 (JP) ............................................. 11-267005

(51) Int. Cl.$^7$ .................... G01B 11/00; G03B 27/42; G03B 27/32
(52) U.S. Cl. ........................ 356/401; 355/53; 355/77
(58) Field of Search ........................ 355/53, 55, 52; 356/399–401; 430/311

(56) References Cited

U.S. PATENT DOCUMENTS 6,396,569 B2 * 5/2002 Zheng et al. ................. 355/77
6,522,386 B1 * 2/2003 Nishi ........................... 355/52
6,538,740 B1 * 3/2003 Shiraishi et al. ............. 356/401
6,542,221 B1 * 4/2003 Tang et al. ................... 355/55

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

A position measuring method and a position measuring system using the same are disclosed. Plural marks of different linewidths are formed at different locations on an object to be measured, and the plural marks are detected, at the different locations and with different focus states. For determination of a measurement mark, such a mark among the plural marks as having a linewidth with which a change in focus characteristic, at the different locations, is smallest, is selected, and then the position measurement is performed to the object by using the determined measurement mark.

11 Claims, 8 Drawing Sheets

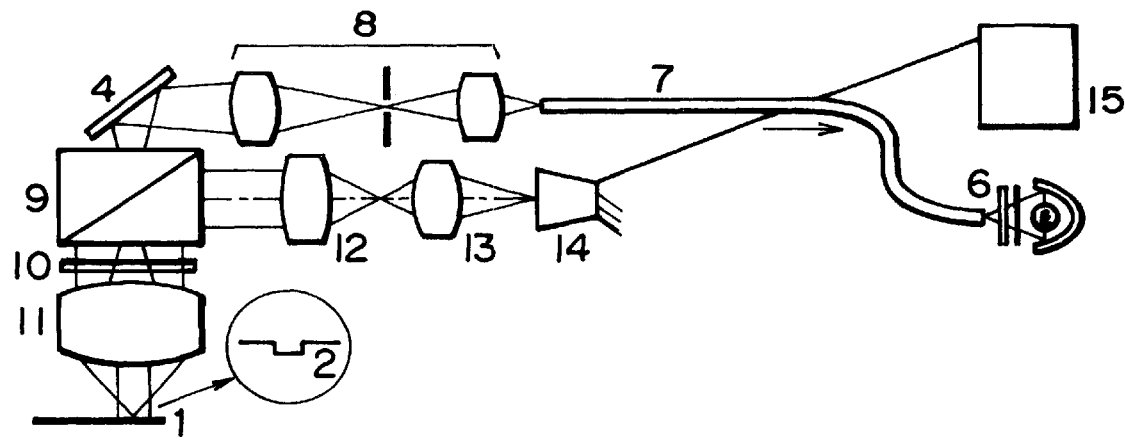
FIG. 2
FIG. 3A  Etch Silicon Oxide 
FIG. 3B  Deposit Tungsten 
FIG. 3C  Chemical Mechanical Polishing 
FIG. 3D  Deposit Al/Si/Cu 
FIG. 3E  Deposit Titanium Nitride 

SYMMETRY CALCULATION

HRP w = 3.2 μm (33 pix)
c = 2.4 μm (25 pix)

$$SYMMETRY\ SV = \frac{W}{M(x)}$$

$$M(x) \equiv \sum_{j=c-w/2}^{c+w/2} |F(x+j) - F(x-j)|$$

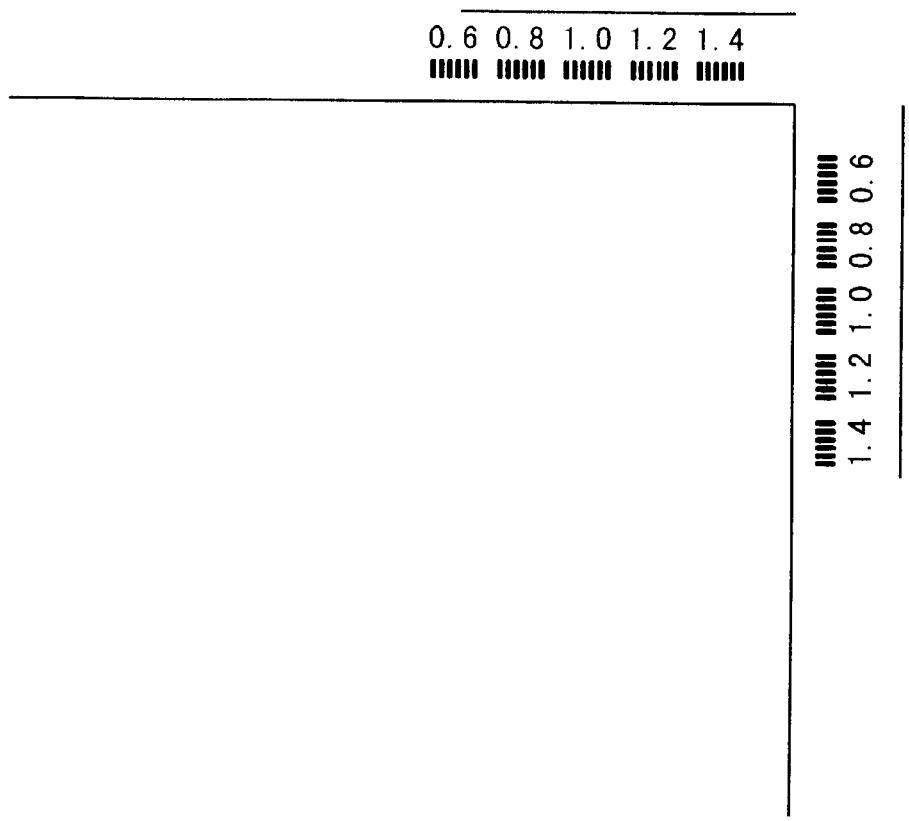
FIG. 7
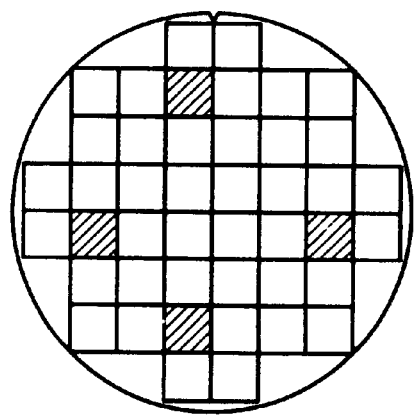
 measurement shot
FIG. 8

Statistical data processing

▨ AGA measurement shot

POSITION MEASURING METHOD AND POSITION MEASURING SYSTEM USING THE SAME

FIELD OF THE INVENTION AND RELATED ART

This invention relates to a position measuring method and a position measuring system. More particularly, the invention concerns a position measuring method and a position measuring system suitably usable, for example, in an alignment system of a semiconductor manufacturing exposure apparatus or in a registration inspection system in the field of semiconductor manufacture, for example, for inspecting the performance of an exposure apparatus. Specifically, the invention concerns a position measuring method and a position measuring system using the same, wherein marks of different shapes are formed beforehand on a wafer which is the subject of measurement and wherein an optimum mark, among them, which enables highest accuracy measurement is selected.

In order to meet further increases in density of an integrated circuit, projection exposure apparatuses for semiconductor manufacture are required to have a higher resolving power for projection exposure of a circuit pattern of a reticle onto a wafer. Various methods have been proposed and investigated in relation to improving the projection resolving power. An example is that the numerical aperture (NA) of a projection optical system is enlarged while holding the wavelength of exposure light fixed. Another example is an exposure method in which a shorter wavelength is used, such as by changing i-line to g-line, then to the emission wavelength of an excimer laser, then to the emission wavelength of a $F_2$ laser and then to synchrotron radiation (SR) light.

On the other hand, in order to meet further miniaturization of a circuit pattern, a reticle having an electronic circuit pattern formed thereon and a wafer must be placed in alignment with each other very accurately. The required alignment accuracy is generally one-third or less of the circuit pattern. If the rule of a circuit pattern of 1 gigabit DRAM is 0.18 micron, the overlay precision should be 60 nm or lower. Here, the overlay precision refers to the alignment accuracy over the whole exposure region.

Further, a registration inspection machine for measuring the overlay precision must have a measurement precision which is one-tenth of the overlay precision. Thus, for a 1 gigabit DRAM, a measurement precision of 6 nm is necessary.

It is known that measurement errors can be categorized into three.
1) Tool Induced Shift (TIS)
2) Wafer Induced Shift (WIS)
3) TIS-WIS Interaction
The error TIS is defined as an error caused by any factor inside a detection system. The error WIS is defined as an error caused by any factor related to the subject of measurement. The error TIS-WIS interaction is defined as an error caused by the interaction between TIS and WIS. In the specification of the subject application, description will be made mainly on a wafer in the semiconductor manufacture, and therefore factors related to the wafer will be considered. However, in the present invention, the subject of measurement is not limited to the wafer. Nevertheless, errors attributable to the subject of measurement will be referred to as WIS, in this specification.

Factors for TIS inside an optical system may be comma aberration of a detection optical system and non-uniformness of an illumination system, for example. Factors for WIS may be the shape of a wafer mark and asymmetry of a resist, for example.

A most fundamental solution for high precision position measurement is to remove TIS and WIS. However, as regards TIS, for example, to this end, it is necessary to reduce comma aberration of an optical system to a level not greater than $\lambda/100$. Practically, this is very difficult to accomplish. If is accomplished, the yield rate is very low and the cost becomes very expensive. Further, in an exact sense, the adjustment of TIS must be made on a main assembly of the apparatus and, therefore, the structure becomes very bulky. This increases the cost of the apparatus.

On the other hand, it has been found that WIS differs with the structure of a mark. Referring now to FIGS. 3A–3E, a metal CMP wafer process will be considered, as an example. After a flattening process such as CMP, apparently, surface steps (surface level differences) of a wafer are all flattened and it seems that there is no surface step remaining. Practically, however, what have been removed by the flattening are those surface steps defined at a certain target linewidth, that is, for example, at the linewidth of a plug linewidth. There still remain surface steps at a portion of a larger linewidth, i.e., a thick linewidth portion. Generally, the subject to be flattened by CMP is, in many cases, a narrowest linewidth portion. In a case of a 0.18 micron process, a value of 0.18 micron is the target value.

FIG. 4 shows an alignment mark which comprises plural marks of oblong shape, having a length 30 microns, and being arrayed at a pitch of 20 microns. Each oblong mark is formed by a continuous line of a narrow width W. FIG. 5 illustrates the relationship of the symmetry and the height of a surface step with respect to the linewidth W of the alignment mark of FIG. 4, while taking the linewidth W as a variable. It is seen that, with increases of the linewidth W, the height of the surface step becomes larger but the signal symmetry thereof is degraded. Here, the signal symmetry can be defined such as shown in FIG. 6.

When the height of a surface step increases, it means that the signal contrast in a detection system becomes higher. Once a detection method in the detection system is fixed, a threshold level corresponding to the smallest value of signal contrast that can be detected by the detection system is determined. Also, a threshold surface step which can be detected in accordance with the determined threshold level as well as a linewidth $W_d$ which defines that threshold surface step, are determined.

On the other hand, if the signal symmetry is not good, it causes a measurement error. A major factor for the signal asymmetry is WIS. The symmetry has a correlation with the detection precision. Once a required alignment accuracy is fixed, a threshold level for tolerable symmetry, for example, is determined. Thus, from the threshold surface step, a linewidth $W_s$ which defines the threshold value for the symmetry is determined.

From the characteristics of increase/decrease in estimated quantities shown in FIG. 5, it is seen that, once the mark linewidth is set between the linewidth $W_d$ that can be determined by the signal contrast and the linewidth $W_s$ being tolerable in respect to the precision, optimization of a mark is accomplished.

FIG. 7 shows a current optimization process for an alignment mark. Currently, when a mark is to be produced first on a wafer in a certain process, the wafer process is executed while plural marks of different linewidths are formed thereon. Here, the process execution means, in the case of a semiconductor exposure apparatus, performing an exposure step and a development step after an alignment step, as well as a measuring step by use of a registration inspection machine. In the case of a registration inspection machine, it refers to advancing the process further to measure the state of registration on the basis of electric characteristics.

After execution of the process, among the marks of different linewidths prepared beforehand, a mark linewidth which is within an optimization linewidth range described hereinbefore is chosen. Currently, however, an optimum mark linewidth can be confirmed only through practical execution of the process. This needs time and operators' works and, therefore, increases the product cost.

SUMMARY OF THE INVENTION

In an alignment method and alignment system according to the present invention, an optimum mark for position measurement can be selected without the necessity of practical execution of a process. For example, as regards marks on a wafer, for example, if there is WIS, the properties of them on the wafer surface are not always even and they involve dispersion. The mark selection, when an alignment operation or a registration measurement operation is to be practically executed, should be determined in total, including the distribution of WIS on the surface.

In the present invention, a particular note has been paid to a fact that, if the symmetry of the mark shape has dispersion along the wafer surface, the focus characteristic differs along the wafer surface. In accordance with the present invention, a linewidth with which a change in focus characteristic is smallest is selected. More specifically, in a preferred embodiment of the present invention to be described later, marks which are formed on a wafer are detected with different focus positions, and one with which a change in focus characteristic along the wafer surface is smallest is selected. Here, the focus characteristic refers to a characteristic of a change of detected values at each focus positions.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is schematic view of the structure of an optical system in a registration inspection apparatus.

FIGS. 3A–3E are schematic views for explaining a metal MCP process.

FIG. 7 is a schematic view of an example where alignment marks having different linewidths are formed on a wafer.

FIG. 8 is a schematic view of an example of the layout of four shots on a wafer, to be measured.

DESCRIPTION OF THE PREFERRED EMBODIMENTS

Figure 4:
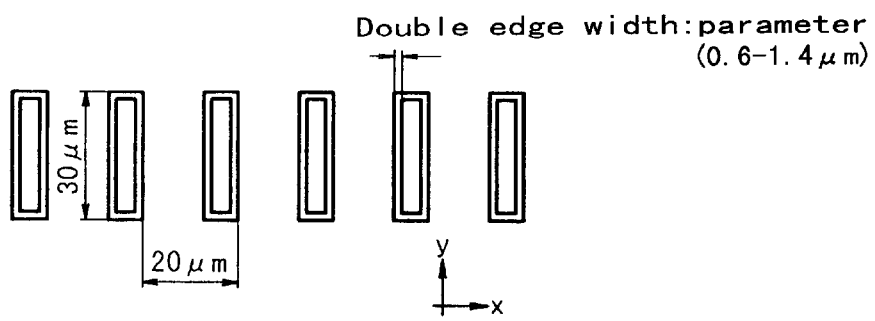
FIG. 4 is a schematic view of the structure of an alignment mark.
Figure 5:
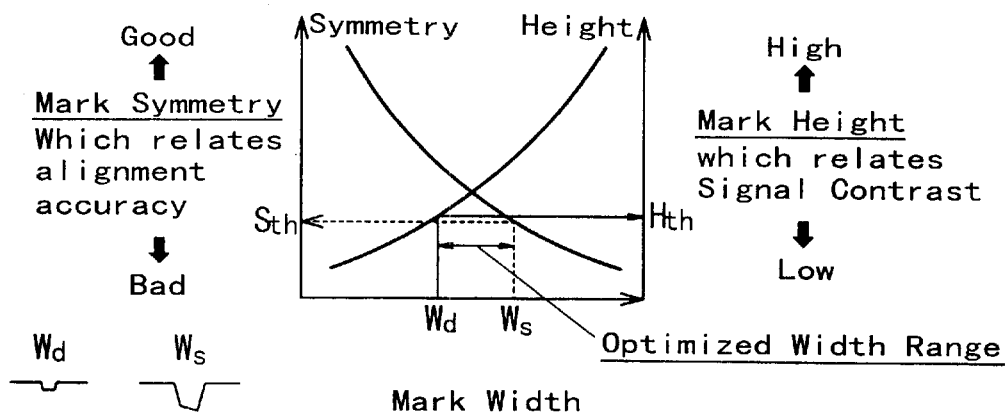
FIG. 5 is a schematic view for explaining the relationship among a mark linewidth, contrast and symmetry.
Figure 6:
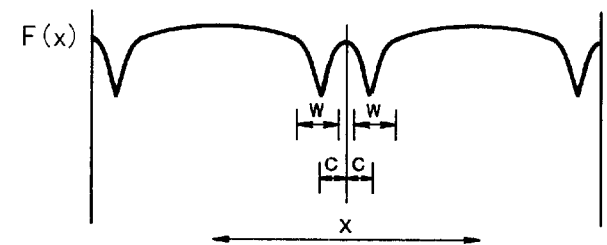
FIG. 6 is a schematic view for explaining the symmetry of an alignment mark signal.

First, an alignment detection system in a semiconductor exposure apparatus will be described, for better understanding of the present invention. FIG. 7 shows alignment marks of different linewidths, formed on a wafer. In FIG. 4, the pitch of alignment marks is 20 microns, and the linewidths of the marks are 0.6 micron, 0.8 micron, 1.0 micron, 1.2 micron and 1.4 micron, respectively. Each of these marks are then measured at different focus positions. The focus values may be, while they depend on the condition in a detection optical system, at the position of a best focus plane and positions at ±3 microns before and after the best focus plane. As regards the measurement, in an example of shot layout shown in, FIG. 8, the measurement may be made to four shots at diagonal positions, as depicted by hatching. As regards the shots to be measured, preferably those shots which are symmetrical with respect to the center of a wafer (the subject of measurement) may preferably be selected. This is because those factors being symmetrical with respect to the center are major components of WIS.

Figure 1A:
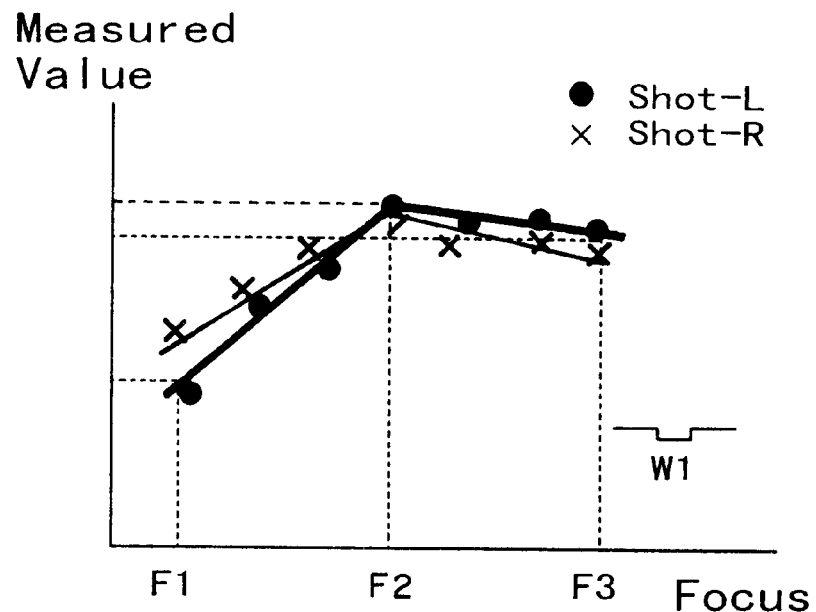
FIGS. 1A and 1B are graphs for explaining the telecentricity which is an estimated quantity used in the present invention.
Figure 1B:
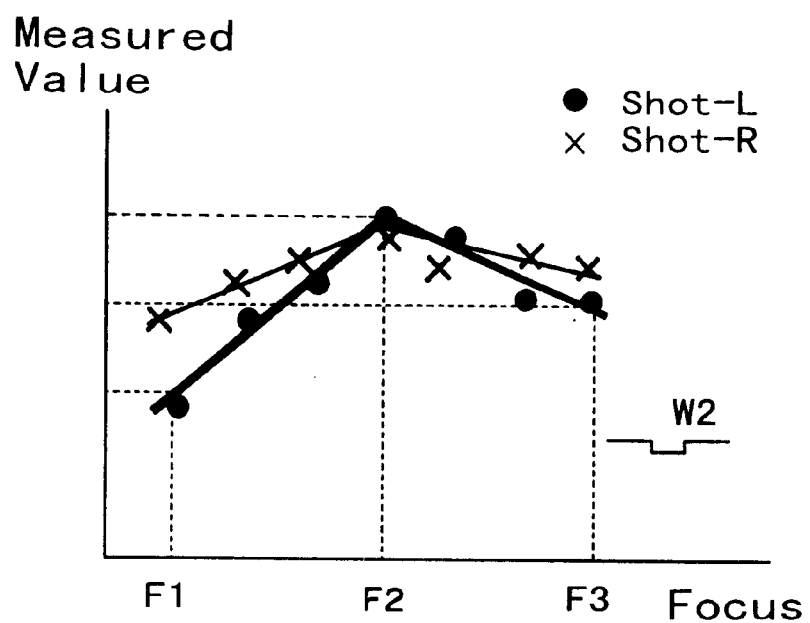

FIGS. 1A and 1B illustrate changes in a measured value as the focus is changed. This is the phenomenon on which the present invention is based. It is seen that, with linewidths $W_1$ and $W_2$, changes in a measured value with the focus change are different not only in dependence upon the mark structure but also between the right-hand and left-hand positions of the wafer.

The focus-dependent positional deviation characteristic such as illustrated in FIGS. 1A or 1B is called also as "telecentricity" (verticality of detection) in the field of a measuring system for semiconductor manufacture. The term "telecentricity" originally refers to that a pupil of an optical system is at an infinite and a principle ray off the optical axis is parallel to the optical axis. It does not directly correspond to the verticality of measurement. However, in a wide sense that a measured value does not change with a focus, the same term is used in the on-axis measurement.

The telecentricity is produced in accordance with factors for measurement errors as described hereinbefore. Namely, in an example where there is no WIS and only TIS is present, the telecentricity is produced by a comma aberration of an optical system or non-uniformness of an illumination system (1998 Optics Symposium). Inversely, the comma or non-uniformness can be estimated on the basis of the telecentricity.

Also, in a registration apparatus, by measuring TIS while changing the focus, a comma aberration of an optical system or non-uniformness of an illumination system may be estimated similarly. Correction may be done in the alignment measurement, while taking them into consideration.

However, if there is WIS in addition to TIS, the telecentricity changes due to it as well as by the TIS-WIS interaction. Therefore, for prevention of an alignment measurement error, it is effective to perform the alignment measurement while reducing the WIS.

In an embodiment of the present invention, any dispersion of WIS is monitored on the basis of a change in characteristic of the telecentricity, and an optimum mark is then determined.

In this embodiment of the present invention, for determination of an optimum mark, different alignment marks on a wafer surface are measured first. Variableness of telecentricity along the wafer surface means variableness of the symmetry of a mark shape with the wafer position. Namely, it means dispersion of WIS. In a global alignment sequence, WIS may cause a scaling error or a rotation error and, therefore, it is a factor for precision deterioration.

In this embodiment, among plural marks having been measured, a mark with which a change in telecentricity (as a focus characteristic) between shots is smallest, in other words, a mark with which a change in symmetry of wafer mark shape between shots, as the focus is changed, is smallest, is selected. The selection procedure described above enables selection of an alignment mark, among option marks, with which highest alignment accuracy is attainable (that is, the influence of WIS can be held minimum).

Now, the sequence using the present invention will be described. The structure of an exposure apparatus will be explained first.

Figure 13:
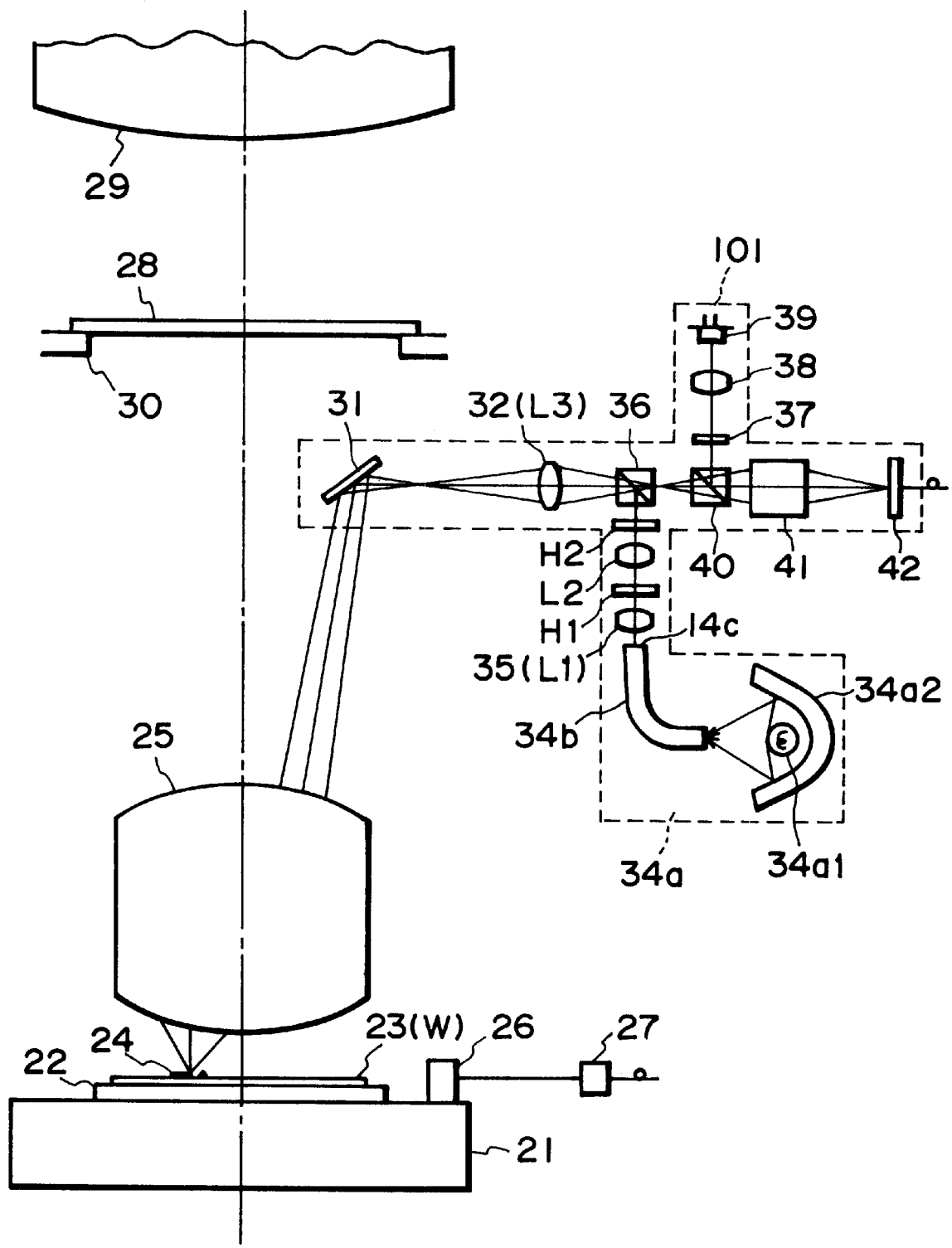
FIG. 13 is a schematic view of an example of an exposure apparatus having a TTL off-axis scope incorporated to perform the AGE.

In FIG. 13, denoted at 28 is a reticle (first object) which is placed on a reticle stage 30. Denoted at 23 is a wafer (second object) having an alignment mark 24 for auto-alignment, formed thereon. Denoted at 25 is a projection optical system which comprises a projection lens system, and it serves to project a circuit pattern or the like formed on the surface of the reticle (or mask) 28 onto the surface of the wafer 23. The projection lens system 25 is a telecentric system both on the reticle 28 side and on the wafer 23 side.

Denoted at 29 is an illumination system for exposure process. It serves to illuminate the reticle 28 with exposure light. Denoted at 22 is a θ-Z stage for carrying a wafer 23 thereon. It functions to perform θ rotation and focus adjustment (Z-direction adjustment) for the wafer 23. The θ-Z stage 22 is mounted on an X-Y stage 21 for high-precision step motion. The X-Y stage 21 has an optical square mirror (bar mirror) 26 mounted thereon, and it serves to provide a reference for the measurement of the position of the stage. This optical square 26 is monitored by using a laser interferometer 27.

In this embodiment, the alignment between the reticle 28 and the wafer 23 is accomplished indirectly, by registering them with respect to a reference mark 37, wherein the positional relationship of the reticle and the wafer with the reference mark is detected beforehand. As an alternative, a pattern of a resist image or the like may be actually printed by exposure after an alignment operation, and any error (offset) may be measured and, on the basis of which, an offset processing may be done thereafter.

Next, components of detecting means 101 for detecting the position of the auto-alignment mark 24 on the wafer 23 surface through a non-exposure light TTL method will be described. It should be noted here that, in this embodiment, an exposure light TTL method or an off-axis method may be used.

Denoted at 34a is light source means for detecting (illuminating) the mark 24. It comprises a halogen lamp 34a₁ for emitting light (non-exposure light) of a wavelength different from that of the exposure light (light used for the exposure process), and an elliptical mirror 34a₂. Denoted at 34b is a fiber (fiber bundle) for directing the light from the light source means 34a. It emits a light beam from its light exit surface 34c.

Denoted at 35 (L₁) is a lens for collecting the light beam (detection light) from the light exit surface 34b of the fiber and projecting it to a lens L₂ through a hologram H₁. After being incident on the lens L₂, the light beam is projected on another hologram H₂ which is disposed between the lens L₂ and a beam splitter 36. Thereafter, the light beam enters an objective lens 32.

Here, the hologram H₁ is defined on a plane which is optically conjugate with the wafer 23 surface which is the surface (object surface) to be illuminated. Also, the hologram H₂ is defined on a pupil plane of the illumination system (corresponding to the exit surface 16c) or a plane optically conjugate therewith.

The light reflected by the beam splitter 36 is collected by the objective lens 32, and then it is reflected by a mirror 31 by which the light is directed through the projection lens system 25 to the mark 24 on the wafer 23 surface, whereby the mark is illuminated with the light. The fiber 34b, the lens 35, the objective lens 32 and the like are components of the illumination system.

Denoted at 39 is a light source for illuminating a reference mark 37, and it comprises a light emitting diode (LED), for example. Denoted at 38 is a lens. The light beam from the light source 39 is collected by the lens 38, and it is directed to the reference mark 37, whereby the mark is illuminated with the light. Denoted at 40 is a beam splitter for the reference mark. It serves to reflect the light beam from the reference mark 37 and to project the same to an erector lens 41. The erector lens 41 functions to image the reference mark 27 and the mark 24 on the wafer 23 surface upon an image pickup surface of a CCD camera 42.

The detecting means 101 of this embodiment comprises the components described above. The objective lens 32, the erector lens 41, the CCD camera 42 and the like are components of an observation system.

Figure 9:
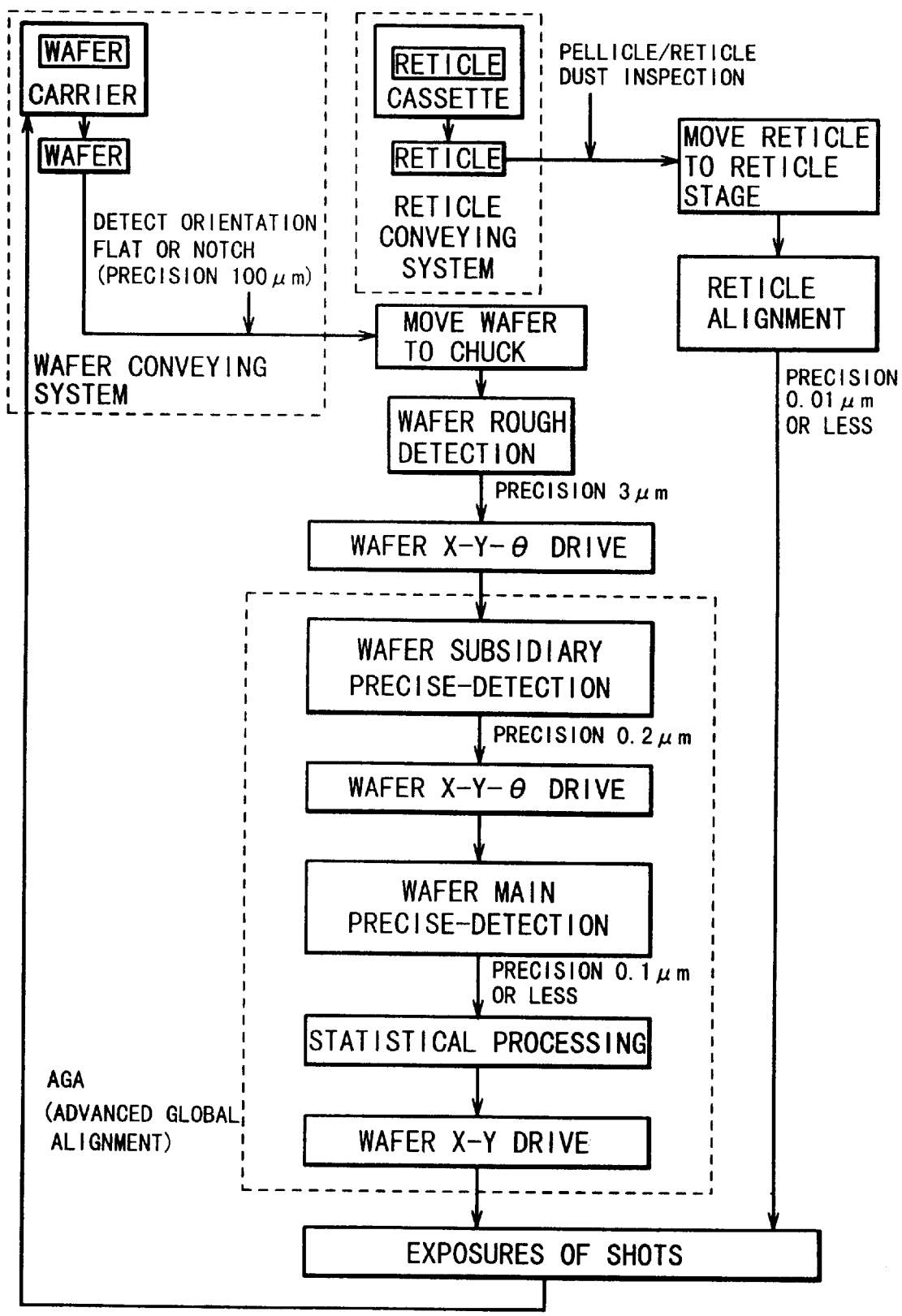
FIG. 9 is a flow chart for explaining an exposure sequence in a conventional exposure apparatus.

FIG. 9 illustrates a conventional exposure sequence. First, a reticle having a pattern to be transferred is conveyed into an exposure apparatus, and then it is brought into alignment with a certain reference defined in the exposure apparatus.

Figure 10:
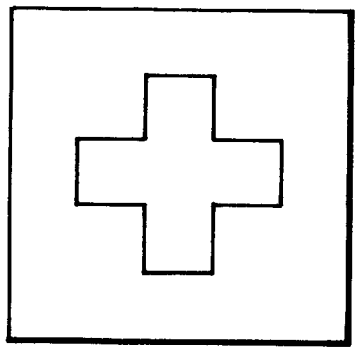
FIG. 10 is a schematic view of an example of a prealignment mark.

On the other hand, a wafer is conveyed onto a wafer chuck and, then, it is measured by prealignment coarse detection at a precision of ±3 microns or less. A mark to be used in this prealignment differs from the alignment mark shown in FIG. 4, and a special mark such as shown in FIG. 10, for example, is used. In a fine alignment procedure to be made after the prealignment procedure, the alignment mark of FIG. 4 is detected by use of a bright-field image processing system 101 such as shown in FIG. 13.

Figure 11A:
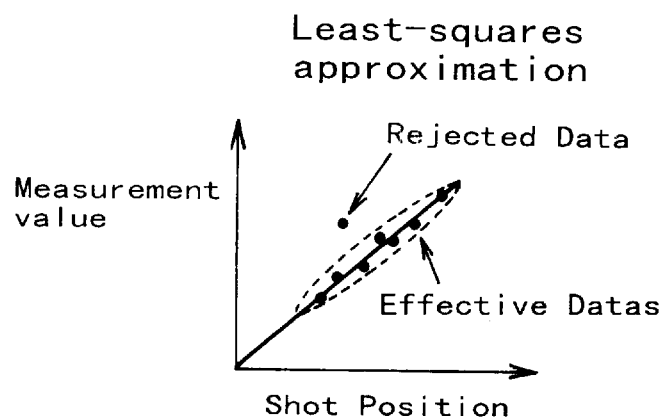
FIGS. 11A and 11B are schematic views for explaining advanced global alignment (AGE) measurement.
Figure 11B:
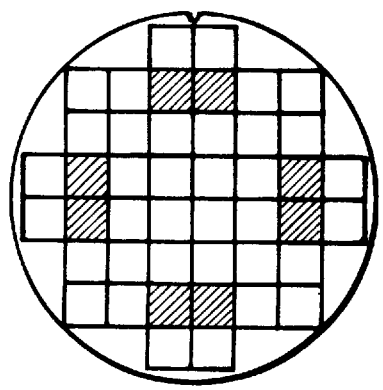

Currently used alignment sequences are global alignment with statistical processing. In an example of a wafer shot layout such as shown in FIG. 11B, marks of plural shots depicted by hatching are measured while moving the X-Y stage having a laser interferometer. The alignment is determined on the basis of data obtainable by excluding abnormal values or the like out of measured values for each shot. After this, the exposure of each shot is carried out. After completion of exposures of all the shots, the waver is conveyed out of the chuck, and a next wafer is supplied. The alignment sequence including sequential operations described above is called an advanced global alignment (AGA).

There are plural alignment marks for measurement. However, one of the alignment marks to be used is selected beforehand in accordance with any method, and the position of that alignment mark is inputted into the exposure apparatus.

Figure 12:
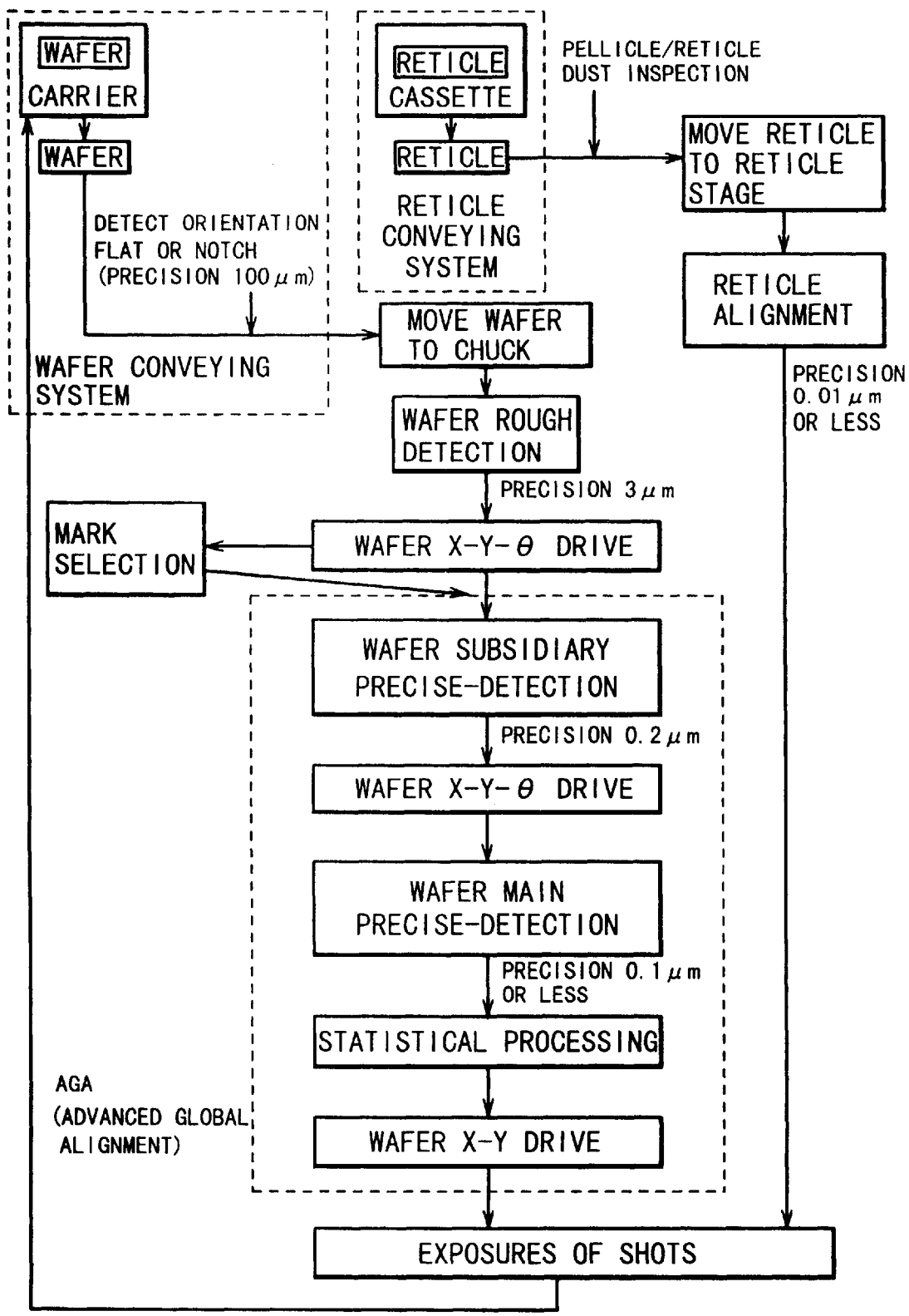
FIG. 12 is a flow chart for explaining an exposure sequence in an exposure apparatus according to the present invention.

FIG. 12 illustrates the sequence according to this embodiment. Basically, the sequence of FIG. 12 corresponds to one in which a mark selection process is added to the sequence of FIG. 9. The procedure from the wafer conveyance to the prealignment is the same as that of FIG. 9 sequence. Subsequently, a mark selection sequence is carried out. The positions of plural usable marks are inputted beforehand into a central processing unit (CPU) for controlling the exposure apparatus. These marks are measured in relation to plural predetermined shots on the wafer, while changing the focus. The types and positions of the marks, the shots to be measured, the focus change quantities and times are important parameters in this embodiment, and they are inputted into the exposure apparatus beforehand. For determination of the mark for alignment measurement, the same shots to be used for the AGA for alignment measurement may preferably be selected as the measurement shots for the mark selection.

In the sequence of FIG. 12, subsequently, the telecentricity of each mark is measured. Then, one of the marks having a linewidth with which the change in characteristic, as the focus is changed, is smallest is chosen. The fine alignment of the wafer may be made on the basis of the measured value for the shot as having been measured in the mark selection process. Alternatively, if necessary, in respect to the mark of the selected linewidth, measurement may be made to an additional shot or shots, and the fine alignment may be carried out on the basis of the thus obtained measurement results. In the former case, the shots for measurement of the telecentricity should be the same as those for the AGA procedure.

By using marks of a linewidth having been determined in this manner, the fine alignment (AGA) procedure is performed. Then, the reticle pattern is transferred to all the shots. Thereafter, a development process and then a deposition process, an etching process, a scribing process and the like are carried out. These processes are repeated plural times, by which devices are produced on the wafer.

Since these procedures are well known in the art, description of details of them will be omitted here.

If there is dispersion of WIS among plural wafers, the mark selection sequence should be done for every wafer. If WIS is stable in a certain process or in a lot, the mark selection may be done only for a first wafer in that process or that lot, and the fine alignment of the remaining wafers may be done by using a mark of the selected linewidth. Thus, the mark selection sequence of the present invention may be done conveniently and selectively in accordance with the state of WIS. If the mark selection is done only in the first wafer, a decrease of throughput is very small as can be disregarded.

FIG. 2 shows an image processing system to which the present invention is applicable. More specifically, it illustrates an embodiment of an optical system for a registration inspection apparatus.

In FIG. 2, there is a silicon etching wafer 1 having patterns 2 and 3, on which a resist pattern which is the subject of registration measurement is formed. A light beam 6 emitted from a halogen lamp 5 goes through a fiber 7, an illumination system 8, a polarization beam splitter 9, and a quarter waveplate 10, and through an objective lens 11, it illuminates two marks 2 and 3.

The reflection light from the two marks is goes back through the objective lens 11 and the quarter waveplate 10, and it is reflected by the polarization beam splitter 9. After this, the light goes through a relay 12 and an erector 13, and it forms an image upon an image pickup surface of a CCD camera 14. The thus formed image is photoelectrically converted by the CCD camera 14, and a corresponding signal is applied through a line to a computer (computing means) 15. The computer 15 performs image processing on the basis of the signal from the CCD 14, whereby the relative positional relationship between the two marks is detected.

In the apparatus of FIG. 2, the wafer is placed on a wafer chuck (not shown), and the wafer chuck is mounted on a θ-Z stage, not shown. The wafer 1 is attracted to the chuck surface, so that the position of the wafer 1 does not shift against various vibrations. Also, the θ-Z stage is mounted on a tilt stage (not shown), such that the wafer 1 can be moved upwardly and downwardly along the focus direction (optical axis direction of the optical system).

While the preceding embodiments have been described with reference to an alignment system in a semiconductor exposure apparatus and a registration inspection apparatus, the present invention is not limited to them. The invention is applicable to any system wherein an image is formed by an optical system and measurement is made thereto.

In the position measuring method and position measuring system described hereinbefore, the phenomenon that, in a wafer which is the subject of measurement, there are marks of linewidths having dispersion of WIS (showing asymmetry) as well as marks of linewidths having no dispersion, is utilized, and a characteristic as can be represented by the telecentricity, that is, the focus characteristic, is measured. On the basis of it, one of the mark which enables a highest precision is selected. The mark selection can be done without execution of an exposure process and the like. The mark selection can be done automatically and the required time and manual operations can be reduced significantly. This is very effective to decrease the product cost.

While the invention has been described with reference to the structures disclosed herein, it is not confined to the details set forth and this application is intended to cover such modifications or changes as may come within the purposes of the improvements or the scope of the following claims.

What is claimed is:

1. A position measuring method, comprising the steps of:
   forming plural marks of different linewidths at different locations on an object to be measured;
   detecting the plural marks, at the different locations and with different focus states;
   selecting, for determination of a measurement mark, such a mark among the plural marks as having a linewidth with which a change in focus characteristic, at the different locations, is smallest; and
   performing the position measurement to the object by using the determined measurement mark.

2. A method according to claim 1, wherein the different locations are disposed approximately symmetrically with respect to a center of the object.

3. A method according to claim 2, wherein the measurement mark to be used in the position measurement is one of the plural marks having been used in the mark detecting step.

4. A method according to claim 1, wherein the object is a wafer.

5. A method according to claim 4, wherein the mark detecting step and the mark selecting step are carried out with respect to every wafer to be measured.

6. A method according to claim 4, wherein the mark detecting step and the mark selecting step are carried out with respect to only a first wafer in a wafer lot, and wherein, for the remaining wafers in the wafer lot, a mark having a linewidth corresponding to that of the selected mark is used as a measurement mark.

7. A method according to claim 4, wherein the mark detecting step and the mark selecting step are carried out with respect to only a first wafer in a predetermined process, and wherein, for the remaining wafers in the predetermined process, a mark having a linewidth corresponding to that of the selected mark is used as a measurement mark.

8. An exposure apparatus, comprising:

position measuring means to be used with a workpiece to be exposed, wherein plural marks of different linewidths are formed at different locations on the workpiece, and wherein said position measuring means has an arrangement for (i) detecting the plural marks, at the different locations and with different focus states, (ii) selecting, for determination of a measurement mark, such a mark among the plural marks as having a linewidth with which a change in focus characteristic, at the different locations, is smallest, and (iii) performing the position measurement to the workpiece by using the determined measurement mark; and exposure means for performing an exposure of the workpiece having its position measured by said position measuring means.

9. A position measuring system, comprising:

a detection system to be used for mark detection; and a control system for controlling said detection system so that plural marks being formed at different locations on an object to be measured and having different linewidths are detected by said detection system, at the different locations and with different focus states, said control system further being operable to select, for determination of a measurement mark, such a mark among the plural marks as having a linewidth with which a change in focus characteristic, at the different locations, is smallest, and also said control system being operable to cause said detection system to perform position measurement to the object by use of the thus determined measurement mark.

10. An exposure apparatus, comprising:

position measuring means including (i) a detecting system to be used for mark detection, and (ii) a control system for controlling said detection system so that plural marks being formed at different locations on a workpiece to be exposed and having different linewidths are detected by said detection system, at the different locations and with different focus states, said control system further being operable to select, for determination of a measurement mark, such a mark among the plural marks as having a linewidth with which a change in focus characteristic, at the different locations, is smallest, and also said control system being operable to cause said detection system to perform position measurement to the workpiece by use of the thus determined measurement mark; and exposure means for performing an exposure of the workpiece having its position measured by said position measuring means.

11. A device manufacturing method, comprising:

a position measuring step including (i) forming plural marks of different linewidths at different locations on a workpiece to be exposed, (ii) detecting the plural marks, at the different locations and with different focus states, (iii) selecting, for determination of a measurement mark, such a mark among the plural marks as having a linewidth with which a change in focus characteristic, at the different locations, is smallest, and (iv) performing the position measurement to the workpiece by using the determined measurement mark;

an exposure step for executing an exposure of the workpiece having its position measured by said position measuring step; and a development step for executing a developing process for the exposed workpiece, for production of a device.

\* \* \* \* \*

UNITED STATES PATENT AND TRADEMARK OFFICE
CERTIFICATE OF CORRECTION

PATENT NO. : 6,639,677 B1  Page 1 of 1
DATED : October 28, 2003
INVENTOR(S) : Hideki Ina et al.

It is certified that error appears in the above-identified patent and that said Letters Patent is hereby corrected as shown below:

Column 1,
Line 34, "a" should read -- an --.

Column 2,
Line 62, "in" should read -- with --.

Column 3,
Line 15, "works" should read -- work --.
Line 40, "tions." should read -- tion. --.

Column 4,
Line 3, "prealign-" should read -- pre-align- --.
Line 39, "in dependence" should read -- depending --.
Line 43, the second occurrence of "as" should be deleted.

Column 7,
Line 27, "in" should read -- with --.
Line 41, after "wafer." the right margin should be closed up.
Line 42, before "Since" the left margin should be closed up.
Line 66, "is" should be deleted.

Column 8,
Line 31, "mark" should read -- marks --.

Signed and Sealed this

Twenty-third Day of March, 2004

JON W. DUDAS
*Acting Director of the United States Patent and Trademark Office*